(12) United States Patent
Yoo et al.

(10) Patent No.: US 10,987,854 B2
(45) Date of Patent: Apr. 27, 2021

(54) APPARATUS FOR MANUFACTURING OF MICRO-CHANNEL AND METHOD FOR MANUFACTURING OF MICRO-CHANNEL USING THE SAME

(71) Applicant: KOREA INSTITUTE OF MACHINERY & MATERIALS, Daejeon (KR)

(72) Inventors: Yeong-eun Yoo, Seoul (KR);
Sung-hwan Chang, Daejeon (KR);
Jung-yup Kim, Daejeon (KR);
Kyung-ho Lee, Seoul (KR)

(73) Assignee: KOREA INSTITUTE OF MACHINERY & MATERIALS, Daejeon (KR)

(*) Notice: Subject to any disclaimer, the term of this patent is extended or adjusted under 35 U.S.C. 154(b) by 335 days.

(21) Appl. No.: 14/903,113

(22) PCT Filed: Jun. 12, 2014

(86) PCT No.: PCT/KR2014/005141
§ 371 (c)(1),
(2) Date: Jan. 6, 2016

(87) PCT Pub. No.: WO2015/005592
PCT Pub. Date: Jan. 15, 2015

(65) Prior Publication Data
US 2016/0185033 A1    Jun. 30, 2016

(30) Foreign Application Priority Data

Jul. 8, 2013  (KR) .................. 10-2013-0079695

(51) Int. Cl.
*B29C 59/02*  (2006.01)
*B01L 9/00*  (2006.01)
(Continued)

(52) U.S. Cl.
CPC ...... *B29C 59/022* (2013.01); *B01L 3/502707* (2013.01); *B01L 9/527* (2013.01);
(Continued)

(58) Field of Classification Search
CPC ......... B81C 3/001; B81C 3/002; B81C 3/003; B81C 3/004; B81C 3/005; B29C 59/022;
(Continued)

(56) References Cited

U.S. PATENT DOCUMENTS

2003/0106799 A1* 6/2003 Covington ........ B01L 3/502707
204/600
2005/0214173 A1* 9/2005 Facer ................ B01L 3/502707
422/400

(Continued)

FOREIGN PATENT DOCUMENTS

DE  2930883 A1 * 2/1981 ............ B31F 1/2845
JP  01281921 A * 11/1989 ............. B29C 65/48
(Continued)

OTHER PUBLICATIONS

Nakamura, Hiroyuki, Translation of JP 2007136292 A, Translated Nov. 8, 2017, Published Jun. 7, 2007, J-PlatPat.*
(Continued)

*Primary Examiner* — Timothy Kennedy
*Assistant Examiner* — Sonny V Nguyen
(74) *Attorney, Agent, or Firm* — Hauptman Ham, LLP (57) ABSTRACT

In an apparatus for manufacturing a micro-channel and a method for manufacturing a micro-channel, the apparatus includes a base member and a holding chamber. The base member includes a first base member having a concave portion and a convex portion, and a second base member covering the concave portion to form a channel. The holding chamber holds the base member thereinside, to form a space uniformly applying a pressure on a surface of the base (Continued)

member. Accordingly, the pressure is uniformly applied on an entire surface of the base member and thus the microchannel may be manufactured.

10 Claims, 5 Drawing Sheets (51) Int. Cl.
  *B81C 3/00* (2006.01)
  *B01L 3/00* (2006.01)
  *B29D 35/00* (2010.01)
(52) U.S. Cl.
  CPC .......... *B81C 3/001* (2013.01); *B29D 35/0054* (2013.01); *B81C 3/004* (2013.01)
(58) Field of Classification Search
  CPC . B29C 65/76; B29C 65/7841; B29C 65/7847; B29C 66/82; B29C 66/8266; B29C 66/81455; B32B 37/1009; B32B 37/1018; B81B 2201/05; B81B 2201/051; B01L 3/502707; B01L 9/527
  See application file for complete search history.

(56) References Cited

U.S. PATENT DOCUMENTS

| 2009/0084496 | A1  | 4/2009  | Fonverne et al. |           |
|--------------|-----|---------|-----------------|-----------|
| 2010/0236705 | A1* | 9/2010  | Chou            | B01L 3/502707 |
|              |     |         |                 | 156/273.7 |
| 2011/0048952 | A1* | 3/2011  | Van Pelt        | B01L 3/502707 |
|              |     |         |                 | 204/600   |
| 2011/0269131 | A1* | 11/2011 | Chiu            | B01L 3/502707 |
|              |     |         |                 | 435/6.11  |
| 2013/0061961 | A1* | 3/2013  | Rapp            | B01L 3/502707 |
|              |     |         |                 | 137/561 A |
| 2014/0216647 | A1* | 8/2014  | Yang            | B29C 65/1635 |
|              |     |         |                 | 156/272.8 |
| 2014/0322100 | A1* | 10/2014 | Laermer         | B01L 3/502715 |
|              |     |         |                 | 422/505   |
| 2015/0034250 | A1* | 2/2015  | Masuda          | B32B 37/06 |
|              |     |         |                 | 156/382   |
| 2020/0055054 | A1* | 2/2020  | Hajipouran Benam | |
|              |     |         |                 | C12M 23/46 |

FOREIGN PATENT DOCUMENTS

| JP | 2006116803 A | 5/2006 |
| JP | 2007136292 A | 6/2007 |
| KR | 1020100060671 A | 6/2010 |
| KR | 1020120106349 A | 9/2012 |

OTHER PUBLICATIONS

Ota, Masaru, Translation of JP 2006116803 A, Translated Nov. 8, 2017, Published May 11, 2006, J-PlatPat.*
Yamaguchi, Katsumi, "Machine translation of JP 1-291921," Translated Jun. 7, 2019, J-Platpat (Year: 2019).*
Grassmann, Hans-Christian, "Machines translation of DE 2930883 A1", Translated Jun. 20, 2020, Espacenet.com. (Year: 2020).*
International Search Report issued in PCT/KR2014/005141 dated Sep. 22, 2014.
Office Action in EP Application No. 14822457.9, dated Jan. 16, 2018, 4pp.

* cited by examiner

Fig. 1

PRIOR ART

APPARATUS FOR MANUFACTURING OF MICRO-CHANNEL AND METHOD FOR MANUFACTURING OF MICRO-CHANNEL USING THE SAME

RELATED APPLICATIONS

The present application is a National Phase of International Application Number PCT/KR2014/005141, filed Jun. 12, 2014, and claims priority from Korea Application Number 10-2013-0079695, filed Jul. 8, 2013.

BACKGROUND

1. Field of Disclosure

The present disclosure of invention relates to an apparatus for manufacturing a micro-channel and a method for manufacturing a micro-channel using the apparatus. More particularly, the present disclosure of invention relates to an apparatus for manufacturing the micro-channel via uniformly pressing base members using the base members having channels and a holding chamber holding the base members, and a method for manufacturing the micro-channel using the apparatus.

2. Description of Related Technology

A micro-channel or a nanochannel is defined as a flow path having a sub-millimeter size or a sub-micro size and used for a micro device and so on.

Recently, as MEMS (micro electro mechanical system) technology is developed and a micro system has more effectiveness in functionality, weight lightening, massive production and so on, a manufacturing of the micro-channel has been more studied to develop more effective device.

Figure 1:
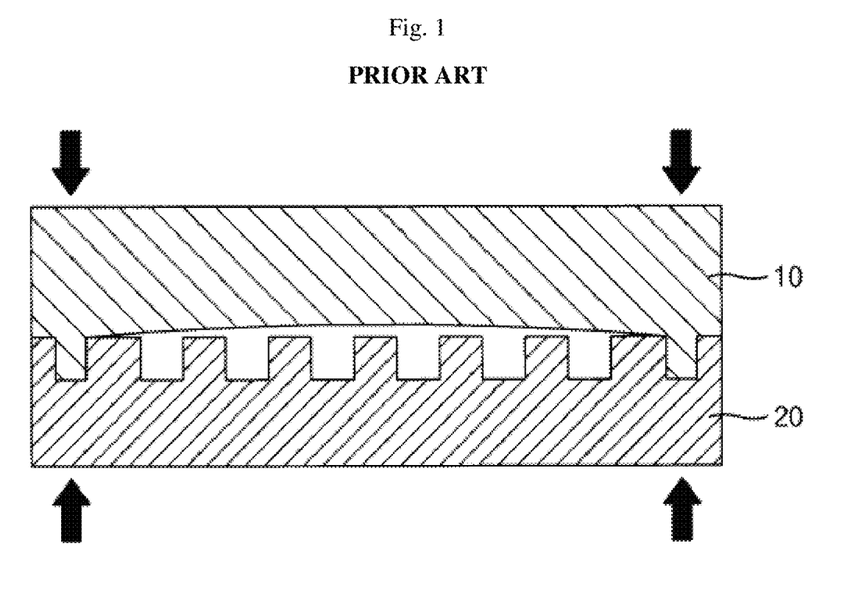
FIG. 1 is a cross-sectional view illustrating a conventional micro-channel.

FIG. 1 is a cross-sectional view illustrating a conventional micro-channel.

As illustrated in FIG. 1, a first base member 10 and a second base member 20 are combined for the conventional micro-channel. After facing two base members, the base members are clamped mechanically along the edge of the base members or bonded using an adhesive, and then the micro-channel is manufactured.

In the micro-channel manufactured mentioned above, a pressure is not uniformly applied to an entire surface of the base members and thus the micro-channel may be easily leaked. In addition, both base members of the micro-channel are mechanically clamped or bonded using the adhesive, and thus the base members may be hardly detached from each other and the micro-channel may not be easily repaired or maintained.

SUMMARY

The present invention is developed to solve the above-mentioned problems of the related arts. The present invention supplies an apparatus for manufacturing a micro-channel via applying an uniform pressure on an entire surface of a base member using a holding chamber. Here, the base member includes a first base member having a concavo-convex portion, and a second base member to form a channel. The holding chamber holds the base member to apply the uniform pressure on the base member.

The present invention also supplies a method for manufacturing the micro-channel via forming the first base member having the concavo-convex portion, forming the channel using the second base member, and uniformly pressing the base member held in the holding chamber.

According to an example embodiment, the apparatus includes a base member and a holding chamber. The base member includes a first base member having a concave portion and a convex portion, and a second base member covering the concave portion to form a channel. The holding chamber holds the base member thereinside, to form a space uniformly applying a pressure on a surface of the base member.

In an example embodiment, the apparatus may further include a fluid supplying module connected to the holding chamber and supplying a fluid into the holding chamber. The fluid supplied into the holding chamber may apply the pressure uniformly on the surface of the base member.

In an example embodiment, the apparatus may further include a fluid suction module connected to the holding chamber and evacuating the fluid inside of the holding chamber. The fluid inside of the holding chamber may be evacuated such that the holding chamber shrinks to apply the pressure uniformly on the surface of the base member.

In an example embodiment, the apparatus may further include a packing layer disposed between the first and second base members, and partially compensating the convex portion of the first base member to uniformize a height of the channel.

In an example embodiment, a thickness of the packing layer may be controlled based on the height of the channel.

According to another example embodiment, the method includes forming a first base member having a concave portion and a convex portion. The concave portion is covered using a second base member to form a channel. The first and second base members is held inside of a holding chamber, to uniformly apply a pressure on a surface of the first and second base members.

In an example embodiment, in applying the pressure, a fluid may be supplied into the holding chamber to apply the pressure uniformly on the surface of the first and second base members.

In an example embodiment, in applying the pressure, a fluid inside of the holding chamber may he evacuated such that the holding chamber shrinks to apply the pressure uniformly on the surface of the first and second base members.

In an example embodiment, the method may further include forming a packing layer on a surface of the convex portion of the first base member before forming the channel.

According to the example embodiments of the present invention, the apparatus includes a base member and a holding chamber. The base member includes a first base member having a concave portion and a convex portion, and a second base member covering the concave portion to form a channel. The holding chamber holds the base member thereinside, to form a space uniformly applying a pressure on a surface of the base member.

In addition, a fluid is supplied into the holding chamber using a fluid supplying module, and thus the pressure is uniformly applied on the surface of the base member.

In addition, the fluid inside of the holding chamber is evacuated by a fluid suction module, and thus the holding chamber shrinks to uniformly apply on the surface of the base member.

In addition, a packing layer is disposed between the first and second base members and the packing layer partially compensates the convex portion of the first base member, and thus a height of the channel may be uniformized.

In addition, in a method for manufacturing the micro-channel, a first base member having a concave portion and a convex portion is formed, the concave portion is covered using a second base member to form a channel, and the first and second base members are held inside of a holding chamber, to uniformly apply a pressure on a surface of the first and second base members.

BRIEF DESCRIPTION OF THE DRAWINGS

The above and other features and advantages will become more apparent by describing exemplary embodiments thereof with reference to the accompanying drawings, in which.

REFERENCE NUMERALS

10: First base member of a conventional micro-channel
20: Second base member of a conventional micro-channel
100: An apparatus for manufacturing a micro-channel according to an example embodiment of the present invention
200: An apparatus for manufacturing a micro-channel according to another example embodiment of the present invention

| 110: Base member | 111: First base member |
| 112: Second base member | 120: Holding chamber |
| 130: Packing layer | 140: Fluid supplying module |
| 240: Fluid suction module | F: Fluid |
| C: Micro-channel | |

DETAILED DESCRIPTION

In an example embodiment will be explained first and same reference numerals are used for same elements and any repetitive explanation will be omitted in another example embodiment.

Hereinafter, exemplary embodiment of the invention will be explained in detail with reference to the accompanying drawings.

Figure 2:
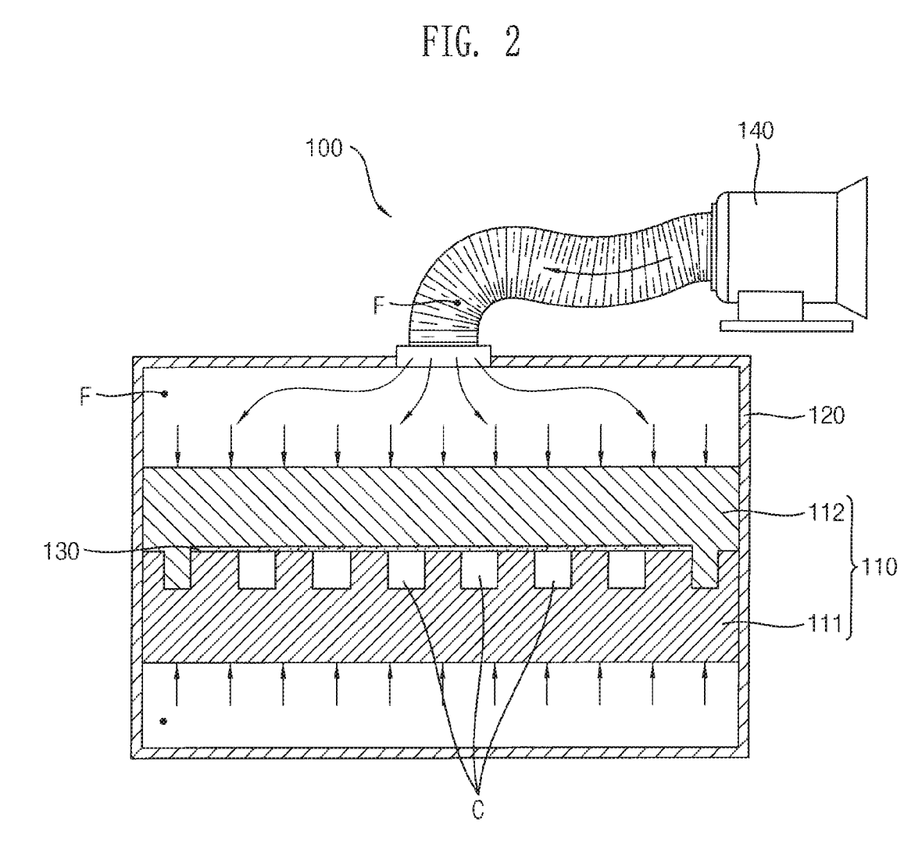
FIG. 2 is a conceptual view illustrating an apparatus for manufacturing a micro-channel according to an example embodiment of the present invention.

FIG. 2 is a conceptual view illustrating an apparatus for manufacturing a micro-channel according to an example embodiment of the present invention.

As illustrated in FIG. 2, an apparatus 100 for manufacturing a micro-channel according to the example embodiment includes a base member 110, a holding chamber 120, a packing layer 130 and a fluid supplying module 140. The base member 110 includes first and second base members 111 and 112 and respective side surfaces which directly contact the inner side surfaces of the holding chamber. The holding chamber 120 holds the base member 110. The packing layer 130 is disposed between the first and second base members 111 and 112. The fluid supplying module 140 supplies a fluid into the holding chamber 120.

The base member 110 includes a micro-channel C, and includes the first and second base members 111 and 112.

The first base member 111 includes a plurality of concave portions and a plurality of convex portions, and the second base member 112 covers the concave portions to form the micro-channel C.

The second base member 112 covers and encloses the concave portions of the first base member 111, to form the micro-channel C.

The convex portions of the first base member 111 make contact with the packing layer 130 formed on a surface of the second base member 112. Thus, when the holding chamber 120 uniformly applies a pressure, the first and second base members 111 and 112 are combined with each other.

The holding chamber 120 holds the base member 110, and the base member 110 is uniformly pressurized in the holding chamber 120.

A pair of ports (not shown) is equipped between an inner portion and an outer portion of the holding chamber 120, so that the micro-channel C inside of the base member 110 may be connected to outside. The ports may be respectively connected to cross-sections of the base member 110 through which the micro-channel C is exposed.

The outside of the port may he bonded tightly to the holding chamber to seal hermetically the holding chamber 120.

The packing layer 130 is disposed between the first and second base members 111 and 112, and the convex portion of the first base member 111 is partially compensated by the packing layer 130, so that a height of the micro-channel C may be uniformized.

The fluid supplying module 140 is connected to the holding chamber 120, and supplies a fluid F to the holding chamber 120.

The fluid F pressurizes entire surface of the base member 110 with a uniform pressure, and thus the first and second base members 111 and 112 are combined with each other.

The fluid may be variously changed by a gas, a liquid and so on, based on a required pressure, and a density or characteristics of the fluid may be changed.

Thus, the micro-channels C manufactured mentioned above may be prevented from being leaked.

In addition, the first and second base members 111 and 112 are combined via the pressure of the fluid, and thus the first and second base members 111 and 112 are easily detached from each other and are easily repaired or maintained, compared to the conventional combination using everlasting bonding methods.

Figure 3:
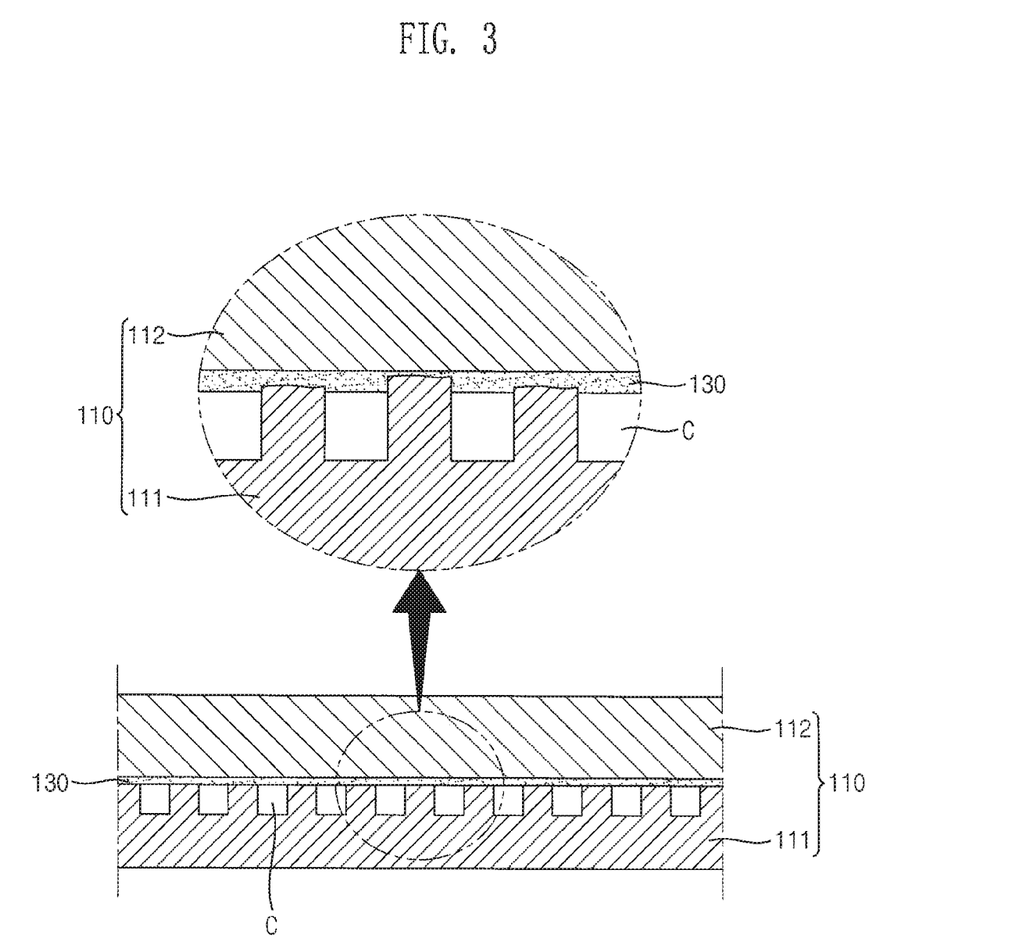
FIG. 3 is a cross-sectional view illustrating a packing layer of a base member of the apparatus for manufacturing the micro-channel in FIG. 2.

FIG. 3 is a cross-sectional view illustrating a packing layer of a base member of the apparatus for manufacturing the micro-channel in FIG. 2.

As illustrated in FIG. 3, the packing layer 130 is disposed between the first and second base members 111 and 112, and partially compensates the convex portion of the first base member 111, to uniformize the height of the micro-channel C.

When the convex portions have heights different from each other, the second base member 112 makes irregular contact with the first base member 111.

Thus, the packing layer 130 having an elastic material is for A on the surface o e concave and convex portions of the first base member 111, and the second base member 112 makes contact with the packing layer 130. Thus, the first and second base members 111 and 112 are combined with each other with the uniform pressure inside of the holding chamber 120.

The packing layer 130 may have elasticity capable of being deformed due to the pressure applied to the base member, but the material of the packing layer 130 is not limited thereto.

In addition, a thickness of the packing layer 130 is controlled by the height of the micro-channel C which is formed due to the combination between the first and second base members 111 and 112. For example, the thickness of the packing layer 130 may be substantially same as or less than 10% of the height of the micro-channel C.

Hereinafter, an apparatus for manufacturing a micro-channel according to another example embodiment of the present invention will be explained.

Figure 4:
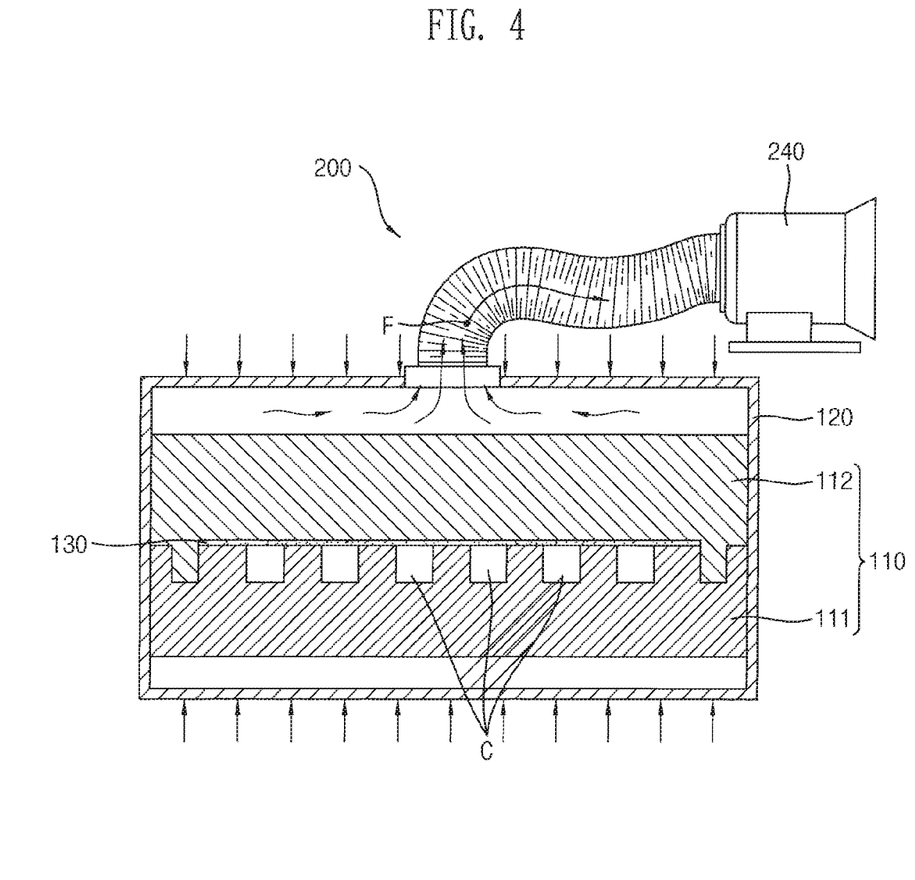
FIG. 4 is a conceptual view illustrating an apparatus for manufacturing a micro-channel according to another example embodiment of the present invention.

FIG. 4 is a conceptual view illustrating an apparatus for manufacturing a micro-channel according to another example embodiment of the present invention.

As illustrated in FIG. 4, the apparatus for manufacturing the micro-channel according to the present example embodiment includes the base member 110, the holding chamber 120, the packing layer 130, and a fluid suction module 240. The base member 110 includes first and second base members 111 and 112. The holding chamber 120 holds the base member 110. The packing layer 130 is disposed between the first and second base members 111 and 112. The fluid suction module 240 evacuates the fluid inside of the holding chamber 120.

The base member 110, the holding chamber 120 and the packing layer 130 are substantially same as mentioned in the previous example embodiment, and repetitive explanation will be omitted.

As illustrated in FIG. 4, the fluid suction module 240 is connected to the holding chamber 120, and the fluid F of the holding chamber 120 is evacuated by the fluid suction module 240.

When the fluid F is evacuated by the suction module 240, the holding chamber 120 shrinks and tightly makes contact with the surface of the base member 110. Thus, the base member 110 may be entirely and uniformly pressurized by the pressure of the outside of the holding chamber 120, and as mentioned in the previous example embodiment, the first and second base members 111 and 112 are combined with each other with the uniform pressure.

Thus, the micro-channel C manufactured via the method above may be prevented from being leaked.

In addition, the first and second base members 111 and 112 are combined via the pressure of the fluid, and thus the first and second base members 111 and 112 are easily detached from each other and are easily repaired or maintained, compared to the conventional combination using everlasting bonding methods.

Hereinafter, a method for manufacturing the micro-channel using the apparatus mentioned above will be detailed explained.

Figure 5:
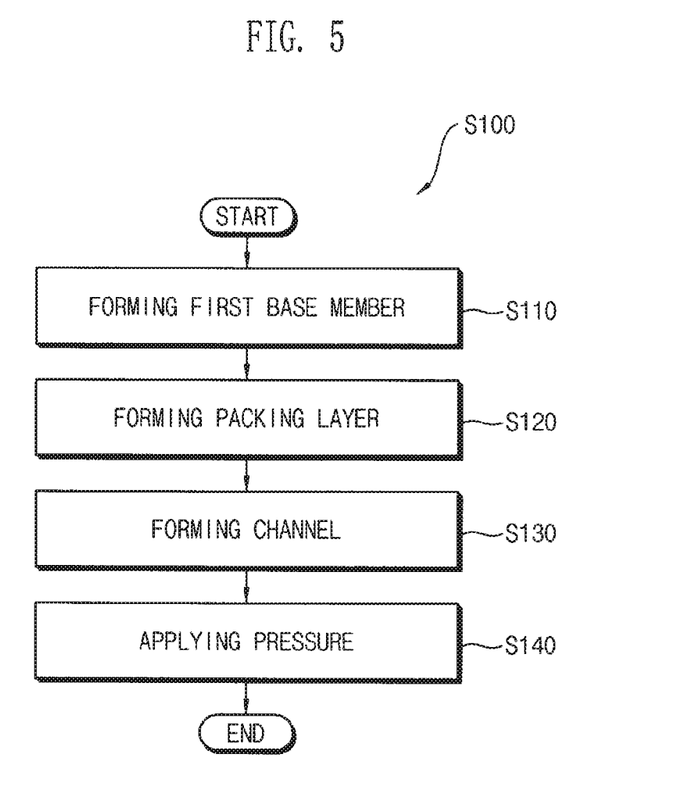
FIG. 5 is a flow chart illustrating a method for manufacturing the micro-channel.

FIG. 5 is a flow chart illustrating a method for manufacturing the micro-channel.

As illustrated in FIG. 5, the method for manufacturing the micro-channel S100, includes forming a first base member S110, forming a packing layer S120, forming a channel S130, and applying a pressure S140.

In forming the first base member S110, the first base member 111 having the concave and convex portions is formed. For example, the first base member 111 may be formed via a photolithography, a nano imprinting, a block co-polymer forming, an anodic aluminum oxide forming, a plastic injection, a compression molding, and so on.

In forming the packing layer S120, the packing layer 130 is formed on the surface of the convex portion of the first base member 111 to partially compensate the convex portion of the first base member 111. For example, the packing layer 130 may be formed via a coating, a laminating, heat or chemical treatment, and so on.

In forming the channel S130, the second base member 112 encloses the concave portion of the first base member 111 to form the micro-channel C. The packing layer 130 on the convex portion of the first base member 111 makes contact with the second base member 112, to form the micro-channel C.

In applying the pressure S140, the first and second base members 111 and 112 are held in the holding chamber 120, and the pressure uniformly applies on the surface of the first and second base members 111 and 112.

The first and second base members 111 and 112 are uniformly pressurized using the fluid supplied into the holding chamber 120, and the holding chamber 120 shrinks via evacuating the fluid inside of the holding chamber 120 to uniformly pressurize the first and second base members 111 and 112.

Accordingly, the micro-channel C may be finally manufactured via the method mentioned above.

According to the example embodiments of the present invention, the pressure may be uniformly applied on the entire surface of the base member to form the micro-channel using the apparatus mentioned above.

In addition, in the apparatus for manufacturing the micro-channel, the base member includes the first base member having the concave portion and the convex portion, and the second base member covering the concave portion to form the channel. The holding chamber holds the base member to uniformly apply the pressure on the surface of the base member.

The foregoing is illustrative of the present teachings and is not to be construed as limiting thereof. Although a few exemplary embodiments have been described, those skilled in the art will readily appreciate from the foregoing that many modifications are possible in the exemplary embodiments without materially departing from the novel teachings and advantages of the present disclosure of invention. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. An apparatus for manufacturing a micro-channel, the apparatus comprising:
   a base member comprising a first base member having a plurality of concave portions and a plurality of convex portions, and a second base member covering the concave portions to form a channel; and
   a holding chamber holding the base member thereinside, an entirety of the base member within the holding chamber,
   wherein an upper space is only formed between the holding chamber and an upper surface of the second base member, and a lower space is only formed between the holding chamber and a lower surface of the first base member,
   wherein a gap or a space connecting the upper space and lower space is not formed between side surfaces of the base member and inner side surfaces of the holding chamber,
   wherein a fluid is supplied into at least one of the upper space and the lower space, and thus a pressure is only applied uniformly on at least one of the upper surface of the second base member and the lower surface of the first base member, wherein a pair of ports is equipped between an inner portion and an outer portion of the holding chamber so that the channel inside the base member is connectable to an outside of the base member within the holding chamber, and wherein the first base member and the second base member are combined with each other due to the applied pressure, to form the channel, and the first base member and the second base member are detached from each other when the pressure is not applied.

2. The apparatus of claim 1, further comprising a fluid supplying module connected to the holding chamber and supplying the fluid into the holding chamber, wherein the fluid supplied into the holding chamber applies the pressure uniformly on said at least one of the upper surface of the second base member and the lower surface of the first base member.

3. The apparatus of claim 2, further comprising a packing layer disposed between the first base member and the second base member, and partially compensating the convex portions of the first base member to uniformize a height of the channel.

4. The apparatus of claim 1, further comprising a packing layer disposed between the first base member and the second base member, and partially compensating the convex portions of the first base member to uniformize a height of the channel.

5. The apparatus of claim 4, wherein a thickness of the packing layer is controlled based on the height of the channel.

6. The apparatus of claim 1, wherein the fluid is supplied into the at least one of the upper space and the lower space, and thus the pressure is only applied uniformly on an entirety of the at least one of the upper surface of the second base member and the lower surface of the first base member.

7. A method for manufacturing a micro-channel, the method comprising:

forming a base member comprising a first base member having a plurality of concave portions and a plurality of convex portions;

covering the concave portions using a second base member to form a channel; and holding the first and second base members inside of a holding chamber, an entirety of the base member within the holding chamber, to uniformly apply a pressure on a surface of the first and second base members, wherein an upper space is only formed between the holding chamber and an upper surface of the second base member, and a lower space is only formed between the holding chamber and a lower surface of the first base member, wherein a gap or a space connecting the upper space and lower space is not formed between side surfaces of the base member and inner side surfaces of the holding chamber, wherein a fluid is supplied into at least one of the upper space and the lower space, and thus a pressure is only applied uniformly on at least one of the upper surface of the second base member and the lower surface of the first base member, wherein a pair of ports is equipped between an inner portion and an outer portion of the holding chamber so that the channel inside the base member is connectable to an outside of the base member within the holding chamber, and wherein the first base member and the second base member are combined with each other due to the applied pressure, to form the channel, and the first base member and the second base member are detached from each other when the pressure is not applied.

8. The method of claim 7, wherein in applying the pressure, the fluid is supplied into the holding chamber to apply the pressure uniformly on the surface of the first and second base members.

9. The method of claim 7, further comprising forming a packing layer on a surface of the convex portions of the first base member before forming the channel.

10. An apparatus for manufacturing a micro-channel, the apparatus comprising:

a base member comprising a first base member having a plurality of concave portions and a plurality of convex portions, and a second base member covering the concave portions to form a channel; and a holding chamber holding the base member thereinside, an entirety of the base member within the holding chamber, wherein an upper space is only formed between the holding chamber and an upper surface of the second base member, and a lower space is only formed between the holding chamber and a lower surface of the first base member, wherein a gap or a space connecting the upper space and lower space is not formed between side surfaces of the base member and inner side surfaces of the holding chamber, wherein a fluid is supplied into at least one of the upper space and the lower space, and thus a pressure is only applied uniformly on an entirety of at least one of the upper surface of the second base member and the lower surface of the first base member, wherein a pair of ports is equipped between an inner portion and an outer portion of the holding chamber so that the channel inside the base member is connectable to an outside of the base member within the holding chamber, and wherein the first base member and the second base member are combined with each other due to the applied pressure, to form the channel, and the first base member and the second base member are detached from each other when the pressure is not applied.

* * * * *